Feb. 1, 1955 C. DE B. WHITE ET AL 2,701,281

AMPLIFIER EMPLOYING SEMICONDUCTOR

Filed March 28, 1950

Inventors
CHARLES DEB. WHITE
KENNETH A. MATTHEWS

By R. P. Morris

Attorney

United States Patent Office 2,701,281 Patented Feb. 1, 1955

2,701,281

AMPLIFIER EMPLOYING SEMICONDUCTOR

Charles de Boismaison White and Kenneth Albert Matthews, London, England, assignors to International Standard Electric Corporation, New York, N. Y.

Application March 28, 1950, Serial No. 152,302

Claims priority, application Great Britain April 1, 1949

1 Claim. (Cl. 179—171)

This application is a continuation-in-part of our application Serial No. 152,301, filed March 28, 1950.

The present invention relates to electric amplifying devices employing semi-conducting materials, which have been called for convenience "crystal triodes."

It is already known that certain crystalline semi-conducting materials are suitable for use as point-contact rectifiers (generally known as crystal detectors) and that such a material may be made to act as an amplifier by mounting a body of the material on or in a suitable metal base or holder which makes electrical contact with the body over an extended area, and by providing it with two fine wire electrodes or cat's whiskers arranged very close together in contact with the surface of the body. By suitably polarising the electrodes with respect to the base the device can be made to operate as an amplifier similarly to a thermionic valve, and for this reason the device has been called a "crystal triode" by analogy. However the word "triode" is not intended to be restricted to a device having just three electrodes; as in the case of thermionic valves there may be additional electrodes employed for control purposes.

In such crystal triodes known hitherto, two cat's whisker electrodes are provided, and one of them called the emitter electrode, is polarised with respect to the base electrode in the good conducting or low resistance direction, while the other, called the collector electrode, is polarised with respect to the base in the poor conducting or high resistance direction. The best semi-conducting material at present known for this purpose is germanium, and a suitable material for the cat's whiskers is Phosphor bronze.

We have found that if an additional cat's whisker electrode be provided, and be suitably placed with respect to the emitter and collector electrodes, and if it be polarised with respect to the base electrode in the same direction as the emitter electrode, the collector current-emitter current characteristic of the device may be modified, and the amplification of the device may be increased. The additional cat's whisker thus operates analogously to an additional grid electrode in a thermionic valve, and for this reason will be called "the controller."

According to the invention there is provided an electric amplifying circuit comprising an amplifying device consisting of a semi-conducting body suitable for use in a point-contact rectifier, a base electrode, input and output electrodes in contact with the surface of the body and arranged to operate as emitter and collector electrodes with respect to said base electrode, a cat's whisker controller electrode in contact with the surface of the body at a distance from both the emitter electrode and the collector electrode which exceeds the distance between the emitter and collector electrodes, means for biassing the emitter electrode in the good conducting direction with respect to the base electrode, means for biassing the collector electrode in the poor conducting direction with respect to the base electrode, means for biassing the controller electrode with respect to the base electrode in such manner that the emitter and controller currents are in the same direction, means for applying an input signal between the emitter electrode and the base electrode, and means for connecting an output circuit to the collector and base electrodes.

The invention will be described with reference to the accompanying drawing, in which:

Fig. 1 is intended only to be diagrammatic and does not indicate anything regarding the relative dimensions or arrangement of the parts.

Figure 1:
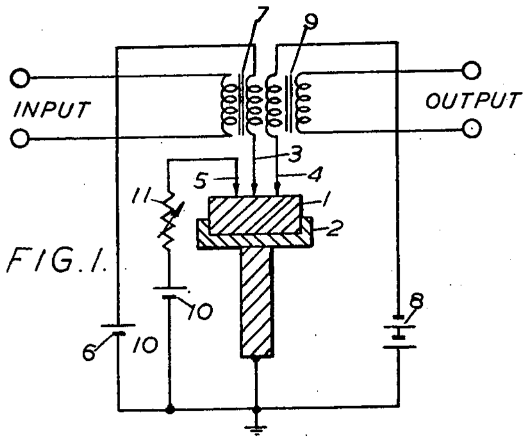
Fig. 1 shows an amplifying circuit according to the invention, including a crystal triode shown in section to which an additional controller electrode has been supplied.

The device shown in section in Fig. 1 comprises a crystal or body of germanium 1 soldered or otherwise electrically connected to a metal base or holder 2. Three fine wire electrodes (cat's whiskers) 3, 4, 5, shown as arrow points, are arranged in contact with the surface of the germanium. Of these the electrodes 3 and 4 are respectively the usual emitter and collector electrodes, while the electrode 5 is the controller electrode provided according to the invention.

Figure 2:
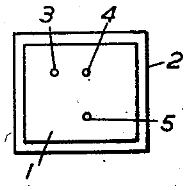
Fig. 2 shows a top view of the device to indicate the relative positions of the electrodes.

As shown in Fig. 2, the electrodes 3 and 4 may be placed about two thousandths of an inch apart, and the controller 5 should be placed rather further away from either of the other electrodes; for example, about 8 thousandths of an inch from the collector electrode 4 on a line at right angles to the line joining the electrodes 3 and 4.

In the study of semi-conducting materials for use in rectifiers, it has been the practice in some circles to divide the materials into two classes, namely N-type materials and P-type materials. In the N-type, the conduction of the current in the material is supposedly due to the migration of a few free electrons, while in the P-type it is said to be due to the migration of what are called "positive holes," that is, deficiencies of electrons in a few atoms of the material. Either type of material can be used for the production of crystal triodes.

It will be assumed for example, that the germanium body 1 is of the N-type. In that case the emitter electrode 3 will be polarised positively with respect to the base electrode 2 (that is, in the good conducting or low resistance direction) by means of a suitable source 6. The secondary winding of an input transformer 7 is connected in series between the source 6 and the emitter electrode 3. The potential of the source 6 should be small, probably less than 1 volt.

The collector electrode 4 is polarised negatively with respect to the base electrode 2 (that is, in the poor conducting or high resistance direction) by means of a suitable source 8, whose potential might be anything between about 5 and 50 volts. The primary winding of an output transformer 9 is connected in series between the source 8 and the electrode 4. Signals to be amplified may be supplied to the primary winding of the input transformer 7, and corresponding amplified signals will then be obtained from the secondary winding of the output transformer 9. The controller 5 should be biassed positively with respect to the base electrode 2, by means of a source 10 having a potential of perhaps a few volts. An adjustable resistance 11 may be inserted in series with the source 10 to permit the current flowing through the electrode 5 to be adjusted. It should be noted that the bias potentials applied to the emitter and controller are of the same sign.

This circuit is given as a simple example of an amplifying circuit employing a device according to the invention. Various other arrangements are possible, the only essential being the proper biassing of the electrodes 3, 4 and 5 with respect to the electrode 2.

If the germanium body 1 is of the P-type, the only necessary modification of the circuit shown is to reverse the connections of each of the sources 6, 8 and 10.

The electrodes 3, 4, 5 preferably consist of fine sharply pointed Phosphor bronze wires or cat's whiskers, and a suitable electro-forming treatment should be applied between the electrodes 3 and 4, preferably the process described in the specification of co-pending application No. 150,412, filed March 18, 1950 to K. A. Matthews and C. de B. White.

Figure 3:
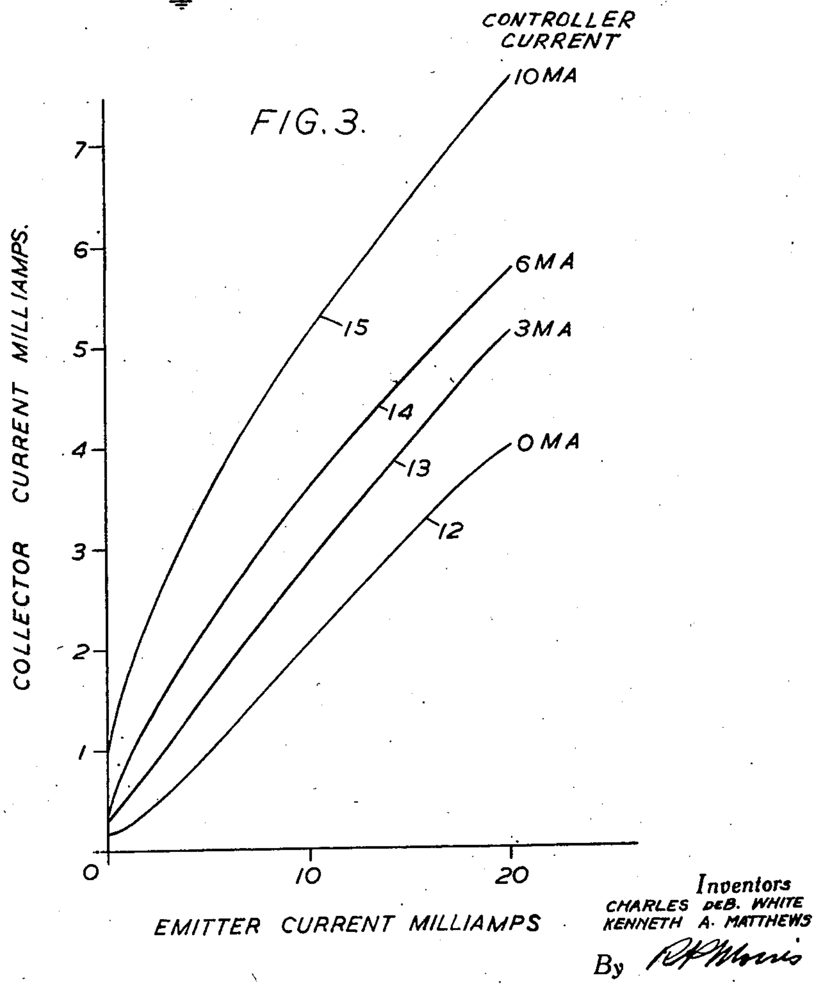
Fig. 3 shows characteristic curves illustrating the effects produced by the controller electrode.

Fig. 3 shows a series of characteristic curves illustrating the effect of the controller 5 on the properties of the crystal triode, for the case in which the electrodes are placed as described with reference to Fig. 2. The abscissae of the curves represent the currents in milliamperes supplied to the emitter electrode 3, and the ordinates represent the corresponding currents in milliamperes obtained from the collector electrode 4. Four curves 12, 13, 14, 15 are given corresponding respectively to values of 0, 3, 6 and 10 milliamperes for the current supplied to the controller electrodes 5. It will be noted that the steepness of the curves progressively increases as the controller current is increased, particularly for small values of the emitter current. The lower end of the curve 15 is very much steeper than the lower end of the curve 12. Thus the gain of the crystal triode may be thus considerably increased by supplying a few milliamperes to the controller. At the same time, the impedance of the output circuit of the crystal triode is reduced.

It should be understood that the controller 5 may be located in various places on the surface of the crystal with respect to the other two electrodes, and not necessarily in the manner shown in Fig. 2. However, it should preferably be placed rather further from either of the other two electrodes 3 and 4, than the distance between them. By adjusting the position of the controller 5 and the current supplied to it, it will be possible to control both the gain of the triode and also its input and output impedances.

It should be understood also, that according to the principles of the copending application No. 152,301 filed March 28, 1950, to K. A. Matthews and C. de B. White, a fourth cat's whisker electrode (not shown), making contact with the surface of the germanium, may be used to take the place of the base or holder 2, to serve as a base electrode common to the other three electrodes.

Although it has been assumed that the semi-conductor employed in the crystal triode is germanium, the principles of the invention may be applied to crystal triodes using other types of semi-conductor.

While the principles of the invention have been described above in connection with specific embodiments, and particular modifications thereof, it is to be clearly understood that this description is made only by way of example and not as a limitation on the scope of the invention.

What is claimed is:

An electric amplifying circuit comprising an amplifying device consisting of a semi-conducting body, a base electrode, input and output electrodes in contact with the surface of the body and operable as emitter and collector electrodes with respect to said base electrode, a controller electrode in contact with the surface of the body, means applying a direct-current bias to said emitter electrode, with respect to the base electrode so as to polarise the contact between the emitter electrode and the body in good conducting direction, means applying a direct-current bias to said collector electrode, with respect to the base electrode so as to polarise the contact between the collector electrode and the body in poor conducting direction, means applying a direct-current bias to said controller electrode, with respect to the base electrode so that the emitter and controller currents are in the same direction, the controller electrode being spaced from each of the collector and emitter electrodes by a distance at least twice the spacing between said collector and emitter electrodes, said distance being such that the gain of the amplifying device can be adjusted by varying the controller current, means for applying an input signal between the emitter electrode and the base electrode, and means for connecting an output circuit to the collector and base electrodes.

References Cited in the file of this patent

UNITED STATES PATENTS

| | | |
|---|---|---|
| 2,476,323 | Rack | July 19, 1949 |
| 2,524,035 | Bardeen et al. | Oct. 3, 1950 |